(12) United States Patent
Yang et al.

(10) Patent No.: US 11,894,390 B2
(45) Date of Patent: Feb. 6, 2024

(54) DISPLAY SUBSTRATE AND MANUFACTURING METHOD THEREOF, DISPLAY PANEL

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Yutong Yang, Beijing (CN); Zhonghao Huang, Beijing (CN); Zhiyong Ning, Beijing (CN); Kai Wang, Beijing (CN); Rui Wang, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 166 days.

(21) Appl. No.: 16/962,578

(22) PCT Filed: Jan. 22, 2020

(86) PCT No.: PCT/CN2020/073881
§ 371 (c)(1),
(2) Date: Jul. 16, 2020

(87) PCT Pub. No.: WO2020/177500
PCT Pub. Date: Sep. 10, 2020

(65) Prior Publication Data
US 2021/0366936 A1    Nov. 25, 2021

(30) Foreign Application Priority Data

Mar. 1, 2019    (CN) .......................... 201910156028.7

(51) Int. Cl.
*H01L 27/12*       (2006.01)
*G02F 1/1362*      (2006.01)
(Continued)

(52) U.S. Cl.
CPC .......... *H01L 27/124* (2013.01); *G02F 1/1339* (2013.01); *G02F 1/13629* (2021.01);
(Continued)

(58) Field of Classification Search
CPC ............... H01L 27/124; H01L 27/1288; H01L 27/3279; H01L 2227/323; G02F 1/13629; G02F 1/1339
(Continued)

(56) References Cited

U.S. PATENT DOCUMENTS 5,953,094 A    9/1999  Matsuoka et al.
8,049,853 B2   11/2011 Park et al.
(Continued)

FOREIGN PATENT DOCUMENTS

CN    101211045 A    7/2008
CN    102314027 A    1/2012
(Continued)

OTHER PUBLICATIONS

Second Chinese Office Action from Chinese Patent Application No. 201910156028.7 dated Apr. 7, 2021.
(Continued)

*Primary Examiner* — Ori Nadav
(74) *Attorney, Agent, or Firm* — Dilworth & Barrese, LLP.; Michael J. Musella, Esq.

(57) ABSTRACT

A display substrate and a manufacturing method thereof and a display panel are disclosed. The display substrate includes a base substrate, a connection electrode, a conductive sealant, a plurality of via-holes respectively in different layers and a bridge electrode. The connection electrode is on the
(Continued)

base substrate; the conductive sealant is at a side, away from the base substrate, of the connection electrode and is electrically connected with the connection electrode via the plurality of via-holes respectively in different layers; the bridge electrode is at least partially in at least one via-hole of the plurality of via-holes, and is electrically connected with the connection electrode and the conductive sealant; in a direction perpendicular to the base substrate, the plurality of via-holes are at least partially not overlapped with each other.

12 Claims, 9 Drawing Sheets

(51) Int. Cl.
    *G02F 1/1339* (2006.01)
    *H10K 59/131* (2023.01)
    *H10K 59/12* (2023.01)
(52) U.S. Cl.
    CPC ..... *H01L 27/1288* (2013.01); *H10K 59/1315* (2023.02); *H10K 59/1201* (2023.02)
(58) Field of Classification Search
    USPC .......................................................... 257/72
    See application file for complete search history.

(56) References Cited

U.S. PATENT DOCUMENTS

| | | | |
|---|---|---|---|
| 9,323,100 B1 | 4/2016 | Feng et al. | |
| 10,013,124 B2* | 7/2018 | Lou | G06F 3/0412 |
| 10,109,654 B2* | 10/2018 | Choi | H01L 27/124 |
| 2008/0111132 A1* | 5/2008 | Wang | H01L 27/1288 257/E27.111 |
| 2012/0327355 A1 | 12/2012 | Cheng et al. | |
| 2014/0335290 A1* | 11/2014 | Zhang | G02F 1/1339 252/511 |
| 2016/0027800 A1* | 1/2016 | Liu | G02F 1/13458 438/151 |
| 2016/0064415 A1* | 3/2016 | Zhan | H01L 27/124 438/151 |
| 2019/0206906 A1* | 7/2019 | Zeng | H01L 27/127 |
| 2021/0055583 A1* | 2/2021 | Song | G02F 1/1339 |
| 2021/0149232 A1* | 5/2021 | Nagami | G02F 1/133514 |

FOREIGN PATENT DOCUMENTS

| | | |
|---|---|---|
| CN | 102354069 A | 2/2012 |
| CN | 102830564 A | 12/2012 |
| CN | 202794782 U | 3/2013 |
| CN | 104319274 A | 1/2015 |
| CN | 14332473 A | 2/2015 |
| CN | 104503131 A | 4/2015 |
| CN | 106098710 A | 11/2016 |
| KR | 20050029019 A | 3/2005 |
| KR | 20070115085 A | 12/2007 |
| WO | 2013080734 A1 | 6/2013 |

OTHER PUBLICATIONS

First Chinese Office Action from Chinese Patent Application No. 201910156028.7 dated Jan. 25, 2021.

* cited by examiner

DISPLAY SUBSTRATE AND MANUFACTURING METHOD THEREOF, DISPLAY PANEL

The present application claims priority to Chinese patent application No. 201910156028.7, filed on Mar. 1, 2019, the entire disclosure of which is incorporated herein by reference as part of the present application.

TECHNICAL FIELD

At least one embodiment of the present disclosure relates to a display substrate and a manufacturing method thereof, and a display panel.

BACKGROUND

A display panel with a small thickness, light weight and a narrow bezel is becoming a trend. The sealant of a display panel is usually in a non-display region at the outer side of a display region. The non-display region usually includes a wiring region, and the wiring region is provided with wires, such as a test wire, a wire for providing voltage signals for a display electrode, etc. The overlapping of the sealant and the wiring region is in favor of reducing the area occupied by the non-display region, and thus the bezel size is reduced. For example, the display panel is an LCD panel of type TN. Generally, the lower substrate of the LCD panel is provided with a power supply circuit, and the wires of the wiring region are also on the lower substrate, so as to allow the wires to be connected with the power supply circuit. A display electrode on the upper substrate of the LCD panel needs to be connected with the power supply circuit through the wires in the wiring region, and the sealant is between the upper substrate and the lower substrate to realize the function of bonding the upper substrate and the lower substrate. However, in the case where the sealant overlaps with the wiring region, the display electrode on the upper substrate needs to be electrically connected with the wires on the lower substrate through the sealant.

SUMMARY

At least one embodiment of the present disclosure provides a display substrate, which comprises: a base substrate, a connection electrode, a conductive sealant, a plurality of via-holes respectively in different layers and a bridge electrode. The connection electrode is on the base substrate; the conductive sealant is at a side, away from the base substrate, of the connection electrode and is electrically connected with the connection electrode via the plurality of via-holes respectively in different layers; the bridge electrode is at least partially in at least one via-hole of the plurality of via-holes, and is electrically connected with the connection electrode and the conductive sealant, in a direction perpendicular to the base substrate, the plurality of via-holes are at least partially not overlapped with each other.

For example, in the display substrate provided by an embodiment of the present disclosure, the plurality of via-holes comprise a first via-hole and a second via-hole, the first via-hole and the second via-hole are at least partially not overlapped with each other in the direction perpendicular to the base substrate. The display substrate further comprises: a first insulation layer, a bridge electrode, and a second insulation layer. The first insulation layer is at the side of the connection electrode away from the base substrate, the first via-hole is in the first insulation layer and exposes at least a part of the connection electrode; at least a part of the bridge electrode is in the first via-hole and is electrically connected with the connection electrode through the first via-hole; and the second insulation layer is at a side, away from the base substrate, of the bridge electrode. The second via-hole is in the second insulation layer and exposes at least a part of the bridge electrode; and the conductive sealant is electrically connected with the bridge electrode through the second via-hole.

For example, the display substrate provided by an embodiment of the present disclosure further comprises: a display region and a non-display region. The display region comprises a plurality of pixels, in which each of the plurality of pixels comprises a first display electrode, and a second display electrode at a side, away from the base substrate, of the first display electrode; the non-display region is at a periphery of the display region; all of the connection electrode, the conductive sealant, and the bridge electrode are in the non-display region; the second display electrode extends from the display region into the non-display region; and the second display electrode is at a side, away from the base substrate, of the conductive sealant and is electrically connected with the conductive sealant.

For example, in the display substrate provided by an embodiment of the present disclosure, the second display electrode is a common electrode, and the connection electrode is configured to provide a common voltage signal to the common electrode.

For example, the display substrate provided by an embodiment of the present disclosure further comprises: an auxiliary electrode, at least a part of the auxiliary electrode is in the second via-hole and the auxiliary electrode electrically connects the conductive sealant and the bridge electrode.

For example, in the display substrate provided by an embodiment of the present disclosure, the auxiliary electrode comprises a first portion outside the second via-hole, and a second portion in the second via-hole, the first portion and the second portion are structured as an integral structure, and the first portion of the auxiliary electrode is in contact with the conductive sealant; the second portion of the auxiliary electrode is between the conductive sealant and the bridge electrode, and the bridge electrode is spaced apart from the conductive sealant by the second portion of the auxiliary electrode, and the second portion is in contact with both of the conductive sealant and the bridge electrode.

For example, in the display substrate provided by an embodiment of the present disclosure, the second portion of the auxiliary electrode exposes a part of the bridge electrode, and is in contact with the bridge electrode, and the conductive sealant is in contact with the bridge electrode through the second via-hole.

For example, in the display substrate provided by an embodiment of the present disclosure, the auxiliary electrode is in the non-display region, a material of the auxiliary electrode is same as a material of the first display electrode, and the auxiliary electrode and the first display electrode are in a same layer.

For example, in the display substrate provided by an embodiment of the present disclosure, the connection electrode comprises a plurality of connection electrode lines intersecting with each other, a shape in a plan view of the connection electrode is a shape of grid; and the display substrate comprises a plurality of the first via-holes, a plurality of the second via-holes and a plurality of the bridge electrodes, and the plurality of bridge electrodes are spaced apart from each other.

For example, in the display substrate provided by an embodiment of the present disclosure, the bridge electrode comprises a plurality of bridge electrode lines intersecting with each other, a shape in a plan view of the bridge electrode is a shape of grid; and both of a total number of the connection electrodes and a total number of the first via-holes are at least one, and a total number of the second via-holes is plural.

For example, the display substrate provided by an embodiment of the present disclosure, further comprises a thin film transistor comprising a source electrode and a drain electrode. A material of the bridge electrode is same as a material of the source electrode and the drain electrode, and the bridge electrode is in a same layer as the source electrode and the drain electrode.

For example, the display substrate provided by an embodiment of the present disclosure further comprises a thin film transistor comprising a gate electrode. A material of the connection electrode is same as a material of the gate electrode, and the connection electrode is in a same layer as the gate electrode.

For example, in the display substrate provided by an embodiment of the present disclosure, an orthographic projection of the first via-hole on the base substrate and an orthographic projection of the second via-hole on the base substrate are completely not overlapped with each other, or, the orthographic projection of the first via-hole on the base substrate and the orthographic projection of the second via-hole on the base substrate are partially overlapped with each other.

For example, in the display substrate provided by an embodiment of the present disclosure, a material of the conductive sealant comprises conductive particles.

At least one embodiment of the present disclosure further provides a display panel, and the display panel comprises any one of the display substrates provides by embodiments of the present disclosure.

At least one embodiment of the present disclosure further provides a manufacturing method of a display substrate, and the manufacturing method of the display substrate comprises: providing a base substrate; forming a connection electrode on the base substrate; forming a conductive sealant at a side, away from the base substrate, of the connection electrode, in which the conductive sealant is electrically connected with the connection electrode through a plurality of via-holes respectively in different layers; and forming a bridge electrode, in which the bridge electrode is at least partially in at least one via-hole of the plurality of via-holes, and is electrically connected with the connection electrode and the conductive sealant. In a direction perpendicular to the base substrate, the plurality of via-holes are at least partially not overlapped with each other.

For example, the manufacturing method of the display substrate provided by an embodiment of the present disclosure further comprises: forming a first insulation layer at a side, away from the base substrate, of the connection electrode; forming a first via-hole in the first insulation layer, in which the first via-hole exposes at least a part of the connection electrode, and the bridge electrode is at least partially in the first via-hole, and is electrically connected with the connection electrode through the first via-hole; forming a second insulation layer at a side of the bridge electrode away from the base substrate; and forming a second via-hole in the second insulation layer, in which the second via-hole exposes at least part of the bridge electrode; the conductive sealant is electrically connected with the bridge electrode through the second via-hole; and forming the bridge electrode, in which at least a part of the bridge electrode is at least one via-hole of the plurality of via-holes, and is electrically connected with the connection electrode and the conductive sealant. The first via-hole and the second via-hole are at least partially not overlapped with each other in the direction perpendicular to the base substrate.

For example, the manufacturing method of the display substrate provided by an embodiment of the present disclosure further comprises: forming a thin film transistor which comprises forming a source electrode and a drain electrode. The bridge electrode, the source electrode and the drain electrode are formed through patterning a same film by one patterning process; and For example, the manufacturing method of the display substrate provided by an embodiment of the present disclosure further comprises: forming a thin film transistor which comprises forming a gate electrode. The connection electrode and the gate electrode are formed through patterning a same film by one patterning process.

For example, the display substrate comprises: a display region and a non-display region; the display region comprises a plurality of pixels; and the non-display region is at a periphery of the display region. The connection electrode, the conductive sealant, and the bridge electrode are in the non-display region. The manufacturing method further comprises: forming a first display electrode, and a second display electrode at a side, away from the base substrate, of the first display electrode in each of the plurality of pixels. The second display electrode extends from the display region into the non-display region, the second display electrode is at a side of the conductive sealant away from the base substrate and is electrically connected with the conductive sealant.

For example, the manufacturing method of the display substrate provided by an embodiment of the present disclosure further comprises: forming an auxiliary electrode in the non-display region. The auxiliary electrode is at least partially in the second via-hole and is electrically connects the conductive sealant and the bridge electrode; the auxiliary electrode and the first display electrode are formed through patterning a same film by one patterning process.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
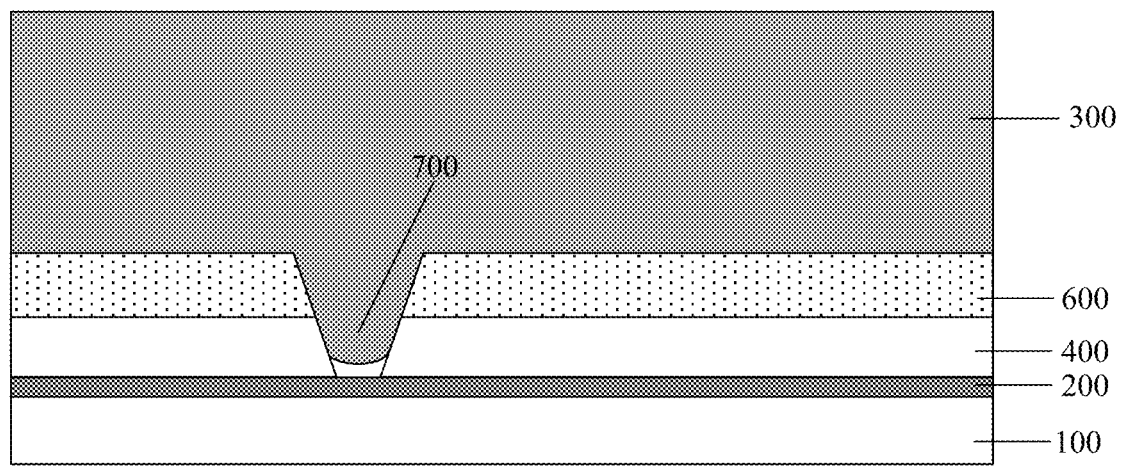
FIG. 1 is a schematic cross-sectional view of a wiring region of a display substrate.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "In," "outside," "on," "under" and the like are only used to indicate relative position relationship, and when the position of the object which is described is changed, the relative position relationship may be changed accordingly.

The accompanying drawings in the present disclosure are not drawn strictly according to actual scale, the number of first via-holes, second via-holes, connection electrodes or bridge electrodes of a display substrate is not limited to the number as illustrated in the figures. The specific size and the number of each structure can be determined according to actual demands. The accompanying drawings described in the present disclosure are only structural schematic diagrams.

It should be noted that, in embodiments of the present disclosure, the depth of a via-hole means the depth of the via-hole in a direction perpendicular to a base substrate. In embodiments of the present disclosure, the expression like "a structure A and a structure B are in a same layer" refers to that the material of the structure A is the same as the material of the structure B, the structure A and the structure B are formed through performing a same patterning process on a same film, and the distance between the structure A and the base substrate is the same as or different from the distance between the structure B and the base substrate. For example, the structure A is the connection electrode of the embodiments of the present disclosure, and the structure B is the gate electrode of the thin film transistor of the embodiments of the present disclosure; for example, the structure A is the bridge electrode of the embodiments of the present disclosure, and the structure B is the source electrode and the drain electrode of the thin film transistor of the embodiments of the present disclosure; for example, the structure A is the auxiliary electrode of the embodiments of the present disclosure, and the structure B is the pixel electrode.

FIG. 1 is a schematic cross-sectional view of a wiring region of a display substrate. As illustrated in FIG. 1, the display substrate comprises a base substrate 100, a first insulation layer 400 on the connection wire 200, and a second insulation layer 600 on the first insulation layer 400; a connection wire 200 is provided in a wiring region of the base substrate 100. The display substrate comprises a via-hole 700 in the first insulation layer 400 and the second insulation layer 600; the via-hole 700 exposes a part of the connection wire 200. The wiring region is further provided with a sealant 300. The sealant 300 is connected with the connection wire 200 through the via-hole 700. The sealant 300 is conductive, so that the sealant 300 is electrically connected with the connection wire 200. If an electrode which is used for display and is electrically connected with the sealant 300, is provided on (and/or provided above) the sealant 300, the sealant 300 allows the connection wire 200 to be electrically connected with the electrode for display, so that voltages can be transmitted to the electrode used for display through the connection wire 200, and the display function is realized. However, if the thicknesses of the first insulation layer 400 and the thicknesses of the second insulation layer 600 are too large, the depth of the via-hole 700 is relatively large. In this case, a segment gap formed by the via-hole 700 can easily cause the sealant 300 to be unable to effectively adhere to the inner surface of the via-hole 700 after the sealant 300 is coated and cured. In this case, on the one hand, the overall adhesion of the sealant 300 is poorer, and at the same time, there is a gap with a certain size under the part, which is located in the via-hole 700, of the sealant 300, and there is residual gas in the gap. In this case, for example, after an LCD panel is formed by adopting the display substrate, during a high-pressure accelerated aging life test (pressure cooker test, PCT) which is performed on the LCD panel, it is easy for gas outside the LCD panel to enter a liquid crystal cell through gaps between the sealant 300 and the upper substrate and the lower substrate of the LCD panel, and bubbles are generated under high temperature conditions, this results in display defects. The residual gas in the via-hole 700 can also enter the liquid crystal cell through pores or gaps in the material of the sealant 300, so that display defects are further aggravated.

At least one embodiment of the present disclosure provides a display substrate, and the display substrate comprises: a base substrate, a connection electrode, a conductive sealant, a plurality of via-holes respectively in different layers and a bridge electrode. The connection electrode is on the base substrate; the conductive sealant is at a side, away from the base substrate, of the connection electrode and is electrically connected with the connection electrode via the plurality of via-holes respectively in different layers; the bridge electrode is at least partially in at least one via-hole of the plurality of via-holes, and is electrically connected with the connection electrode and the conductive sealant; in a direction perpendicular to the base substrate, the plurality of via-holes are at least partially not overlapped with each other.

Figure 2:
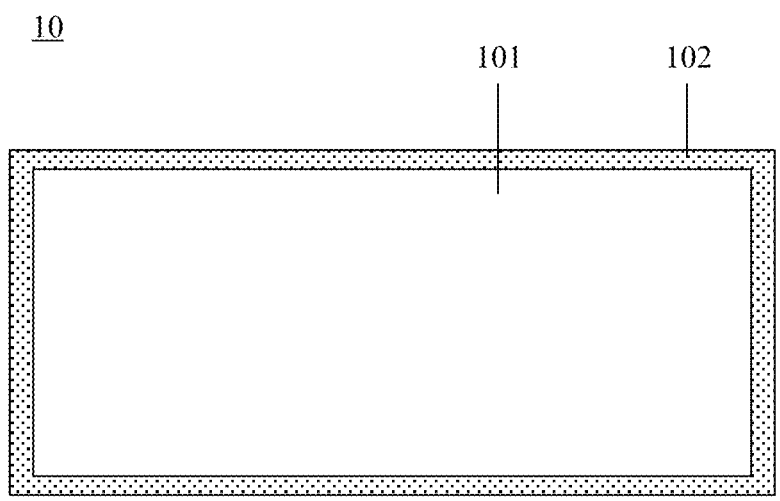
FIG. 2 is a schematic plan view of a display substrate provided by an embodiment of the present disclosure.

Illustratively, FIG. 2 is a schematic plan view of a display substrate provided by an embodiment of the present disclosure. As illustrated in FIG. 2, the display substrate 10 comprises a display region 101 and a non-display region 102 at the periphery of the display region. The non-display region 102 comprises a wiring region, signal conductive components such as a conductive wire and the like are provided in the wiring region. The conductive wire, for example, comprises a wire for testing the display substrate, a wire for providing voltages to a display electrode, and so on. The connection electrode, the conductive sealant, the bridge electrode and the auxiliary electrode in embodiments of the present disclosure are in the non-display region, for example, in the wiring region. The wiring region comprises at least a part of the non-display region 102.

Figure 3:
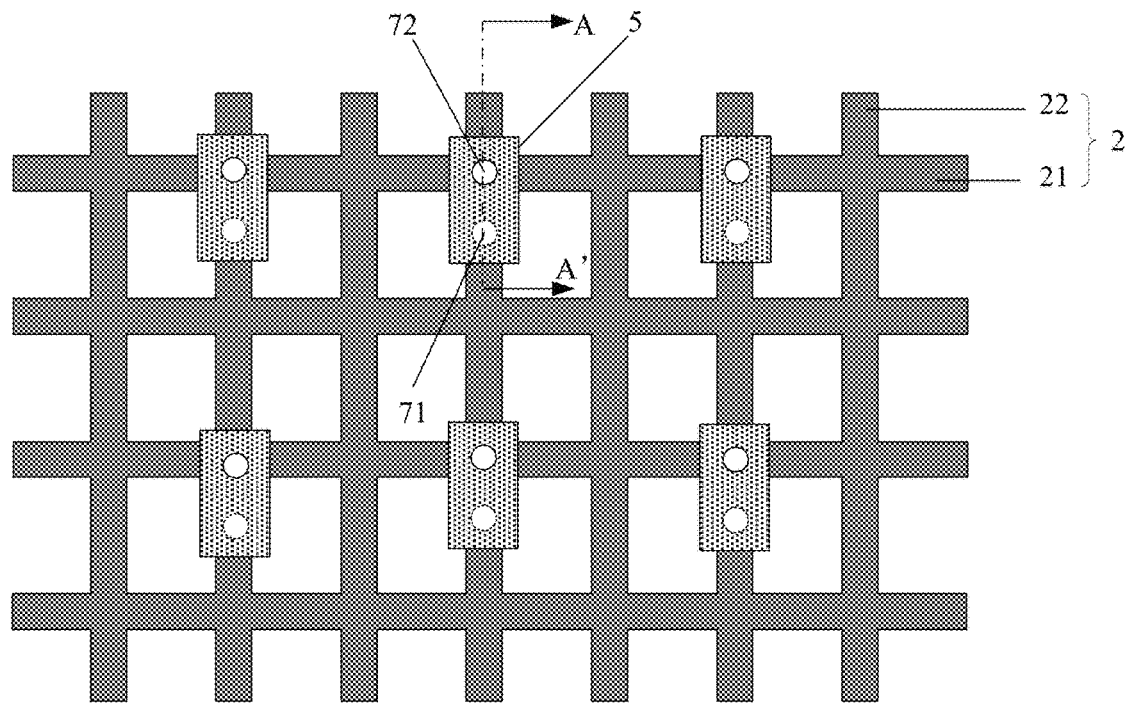
FIG. 3 is a schematic plan view of a part of a wiring region of the display substrate as illustrated in FIG. 2.
Figure 4A:
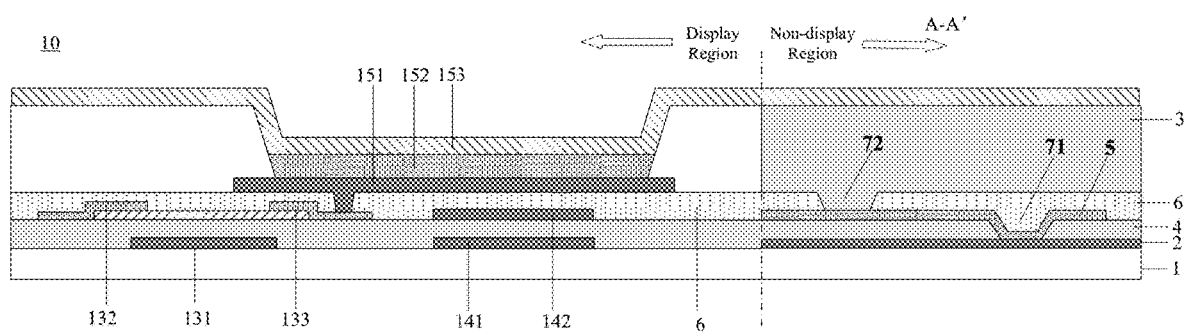
FIG. 4A is a schematic cross-sectional view taken along the line A-A' in FIG. 3 and a schematic cross-sectional view of a pixel region.

FIG. 3 is a schematic plan view of a part of a wiring region of the display substrate as illustrated in FIG. 2, FIG. 4A is a schematic cross-sectional view taken along the line A-A' in FIG. 3. As illustrated in FIG. 3 and FIG. 4A, the display substrate 10 comprises: a base substrate 1, a connection electrode 2, a conductive sealant 3 and a bridge electrode 5. The connection electrode 2 is on the base substrate 1. For example, the plurality of via-holes comprises a first via-hole 71 and a second via-hole 72, and the first via-hole 71 and the second via-hole 72 are respectively in different layers. The conductive sealant 3 is at a side, away from the base substrate 1, of the connection electrode 2; a part of the bridge electrode 5 is in the first via-hole 71, and the bridge electrode 5 is electrically connected with the connection electrode 2, for example, the bridge electrode 5 is in contact with the connection electrode 2. Further, the bridge electrode 5 is electrically connected with the conductive sealant 3, for example, the second via-hole 72 exposes the bridge electrode 5, and the conductive sealant 3 is in contact with the bridge electrode 5 through the second via-hole 72, so that the conductive sealant 3 is electrically connected with the connection electrode 2 through the first via-hole 71, the second via-hole 72 and the bridge electrode 5. Therefore, if an electrode used for display (hereinafter referred to as a display electrode) and electrically connected with the sealant 3 is provided on (or provided above) the sealant 3, the sealant 3 electrically connects the connection electrode 2 and the display electrode, so that voltage signals for display are transmitted to the display electrode through the connection electrode 2, and display function is realized. In the direction perpendicular to the base substrate 1, the first via-hole 71 is not overlapped with the second via-hole 72, that is, an orthographic projection of the first via-hole 71 on the base substrate 1 is not overlapped with an orthographic projection of the second via-hole 72 on the base substrate 1 (no overlapping portion exists), so as to allow the depth of the first via-hole 71 and the depth of the second via-hole 72 to be unable to be superposed in the direction perpendicular to the base substrate 1. In this way, as compared to the case where the conductive sealant 3 is connected with the connection electrode 2 through a relatively deep via-hole passing through a plurality layers that are stacked in the direction perpendicular to the base substrate 1, the depth of each via-hole of the plurality of via-holes respectively in different layers is relatively small, so that the problem that bubbles are generated because of the gap, which is caused by a too deep via-hole, between the conductive sealant 3 and the connection electrode is ameliorated or avoided, so that the display effect is improved. In addition, it is in favor of enhancing the adhering firmness of the conductive sealant and the stability of the display substrate.

As illustrated in FIG. 4A, for example, the display substrate 10 further comprises a first insulation layer 4 and a second insulation layer 6. The first insulation layer 4 and the second insulation layer 6 are stacked in the direction perpendicular to the base substrate 1. The first insulation layer 4 is at the side, away from the base substrate 1, of the connection electrode 2. The first via-hole 71 is in the first insulation layer 4 and exposes a part of the connection electrode 2. The conductive sealant 3 is electrically connected with the bridge electrode 5 through the second via-hole 72. The second insulation layer 6 is at a side, away from the base substrate 1, of the bridge electrode 5, and the second via-hole 72 is in the second insulation layer 6 and exposes at least a part of the bridge electrode 5. The conductive sealant 3 is electrically connected with the bridge electrode 5 through the second via-hole 72, so that the electrical connection between the conductive sealant 3 and the connection electrode 2 is realized. Because the first via-hole 71 and the second via-hole 72 are respectively in the first insulation layer 4 and the second insulation layer 6, and the first via-hole 71 and the second via-hole 72 respectively pass through only one layer, both the depth of the first via-hole 71 and the depth of the second via-hole 72 are within a pre-determined range and the depths are not too large even when the thicknesses of the first insulation layer 4 and the second insulation layer 6 are relatively large, so that the problem that bubbles is generated because of the gap, which is caused by a too deep via-hole, between the conductive sealant 3 and the connection electrode is ameliorated or avoided, and the adhering firmness of the conductive sealant is enhanced.

For example, a material of the connection electrode 2 is a metal material, such as copper, aluminum, copper alloy, aluminum alloy, etc. Obviously, the material of the connection electrode 2 is not limited to the types listed above, and no limitation is given in the present disclosure in this respect.

For example, the above display electrode may be any electrode that required to be electrically connected with the connection electrode 2 in a circuit. With reference to FIG. 2 and FIG. 4A, the display region 101 comprises a plurality of pixels, and each of the plurality of pixels comprises a first display electrode, and a second display electrode at a side, away from the base substrate, of the first display electrode. The connection electrode 2, the conductive sealant 3, and the bridge electrode 5 are in the non-display region 102. The second display electrode extends from the display region 101 into the non-display region 102, the second display electrode is at a side, away from the base substrate 1, of the conductive sealant 3, and is electrically connected with the conductive sealant 3. The above-mentioned display electrode is the second display electrode.

For example, the second display electrode is a common electrode in a liquid crystal display panel, and the connection electrode 2 is a common electrode line that is configured to provide a common signal, for example, a common voltage, to the common electrode; alternatively, for example, the second display electrode is a pixel electrode which is in a liquid crystal display panel and is configured for forming an liquid crystal deflection electric field with a common electrode, and the connection electrode 2 is a pixel voltage line that is configured to provide a pixel voltage to the pixel electrode; alternatively, for example, the second display electrode is a cathode in an organic light emitting diode (OLED) display substrate, and the connection electrode 2 is a first power supply line and is configured to provide a first power supply voltage to the cathode; alternatively, for example, the second display electrode is the source electrode or the drain electrode of a thin film transistor, or may also be a signal line.

For another example, in other embodiments, the second display electrode is a touch control electrode, and the connection electrode 2 is a touch control electrode signal line connected with the touch control electrode. For example, the display panel adopting the display substrate is an in-cell touch control panel.

Illustratively, as illustrated in FIG. 4A, the display substrate 10 further comprises a light-emitting device, and the light-emitting device comprises a first electrode 151, a light-emitting layer 152 and a second electrode 153. In the present embodiment, the above first display electrode is the first electrode 151, the above second display electrode is the second electrode 153. For example, the light-emitting device is an OLED light-emitting device, the first electrode 151 is an anode, the light-emitting layer 152 is an organic light-emitting layer, and the second electrode 153 is a cathode. For example, the cathode is a structure that is disposed in an entire layer and an integral structure, and the cathode covers the display region 101 and the non-display region 102, that is, the above second display electrode is a common electrode. For example, the connection electrode is configured to provide a common voltage signal to the common electrode.

Figure 4B:
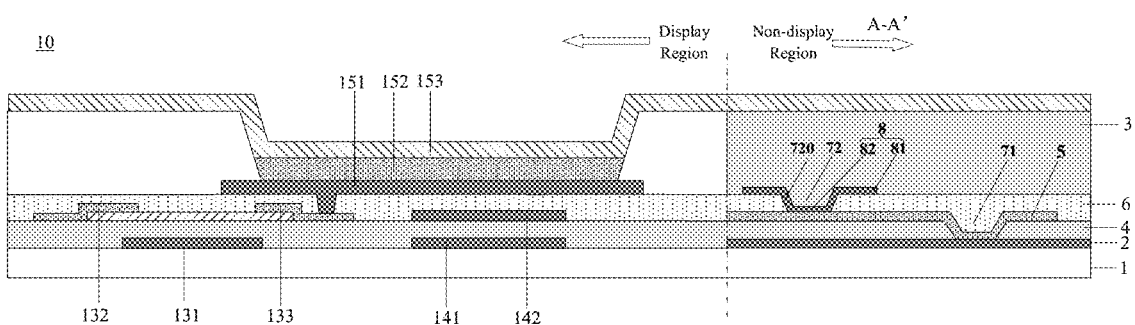
FIG. 4B is another schematic cross-sectional view taken along the line A-A' in FIG. 3 and a schematic cross-sectional view of the pixel region.
Figure 4C:
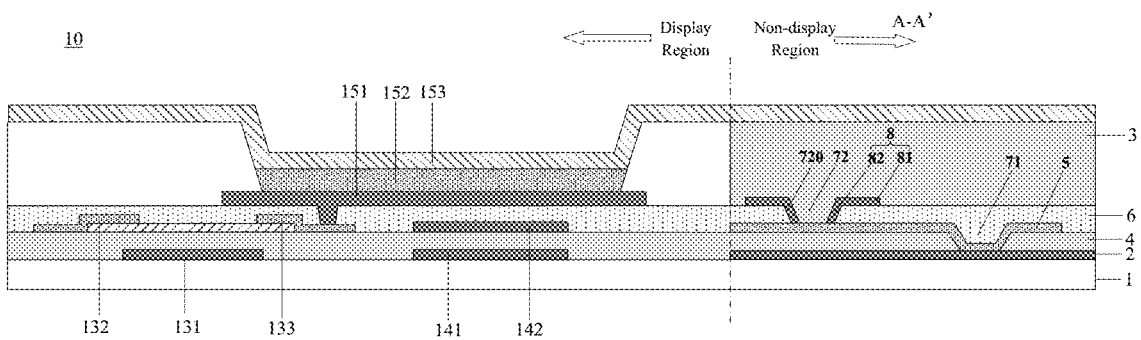
FIG. 4C is a further another schematic cross-sectional view taken along the line A-A' in FIG. 3 and a schematic cross-sectional view of the pixel region.
Figure 4D:
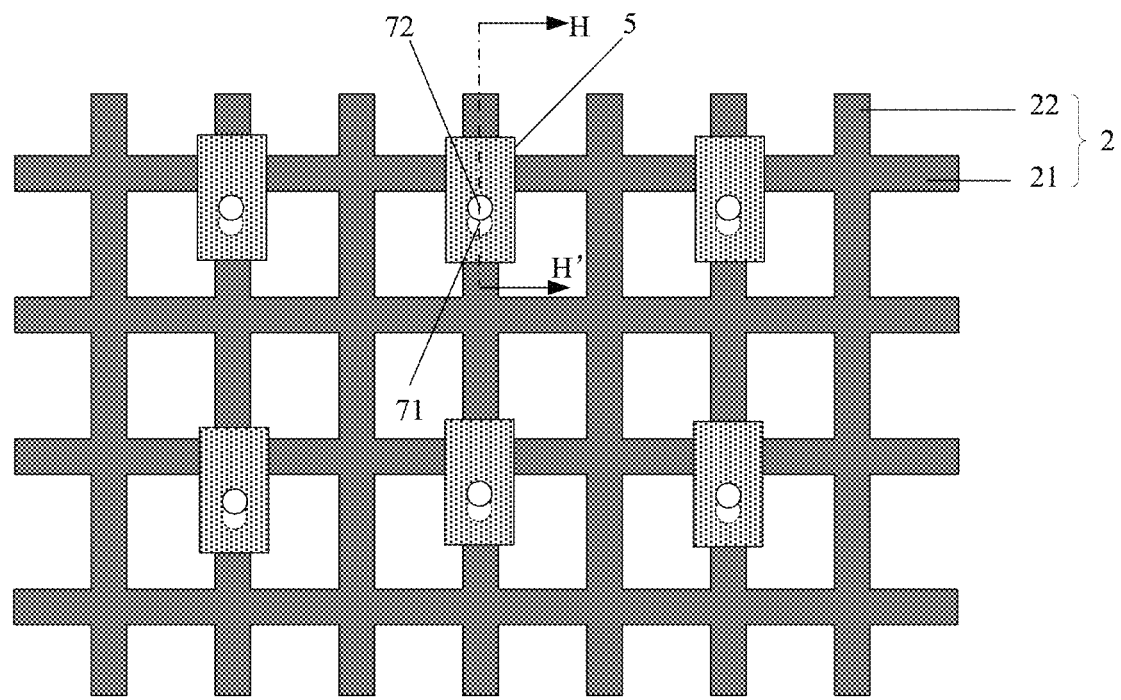
FIG. 4D is another schematic plan view of a part of the wiring region of the display substrate as illustrated in FIG. 2.
Figure 4E:
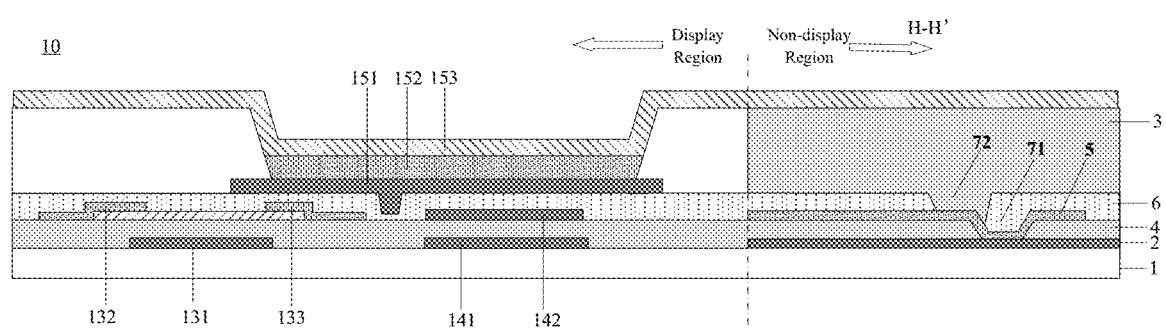
FIG. 4E is a schematic cross-sectional view taken along the line H-H' in FIG. 4D and a schematic cross-sectional view of the pixel region.

For example, as illustrated in FIG. 4A, the display substrate 10 further comprises a thin film transistor, and the thin film transistor comprises a gate electrode 131, a source electrode 132 and a drain electrode 133. The first electrode 151 is electrically connected with the drain electrode 133, for example, the thin film transistor is a switching transistor or a driving transistor, the thin film transistor is in the display region. FIG. 4A is an embodiment taking the case where the thin film transistor is a driving transistor as an example. For example, the display substrate 10 is an OLED display substrate, the thin film transistor is a switching transistor or a driving transistor of a pixel drive circuit in the display region, and the pixel drive circuit is 2T1C, 3T1C . . . 7T1C circuit and so on, which are commonly adopted in the art. Illustratively, FIG. 4G is a schematic diagram of a pixel circuit provided by an embodiment of the present disclosure, and the pixel circuit is a 2T1C pixel circuit which comprises a switching transistor T0, a driving transistor N0 and a storage capacitor Cs, and is configured for driving a light emitting element (for example, an OLED or a quantum dot light emitting diode) to emit light. For example, the gate electrode of the switching transistor T0 is connected with a gate line so as to receive a scanning signal Scan1, for example, the source electrode of the switching transistor T0 is connected with a data line so as to receive a data signal Vdata, the drain electrode of the switching transistor T0 is connected with the gate electrode of the driving transistor N0; the source electrode of the driving transistor N0 is connected with a first voltage terminal through a power supply line, so as to receive a first voltage Vdd (high voltage), the drain electrode of the driving transistor N0 is connected with a positive terminal of the OLED; the first terminal 141 of the storage capacitor Cs is connected with the drain electrode of the switching transistor T0, and the gate electrode 131 of the driving transistor N0 (for example, in other embodiments, the first terminal 141 of the storage capacitor Cs and the gate electrode 131 are integral), and the second terminal 142 of the storage capacitor Cs is connected with the source electrode of the driving transistor N0 and connected with the first voltage terminal through the power supply line; a negative terminal of the OLED is connected with a second voltage terminal through a common cathode (and a cathode ring and so on) so as to receive a second voltage Vss (low voltage, for example, a ground voltage). The thin film transistor as illustrated in FIG. 4A is the driving transistor N0 in FIG. 4G.

For another example, the thin film transistor is a driving transistor in a gate drive circuit (GOA) in the non-display region. No limitation is given to the specific type of the thin film transistor, and the thin film transistor can be designed according to specific needs. For example, the connection electrode 2 and the gate electrode 131 of the thin film transistor are made of a same material and are in a same layer, so that the gate electrode 131 of the thin film transistor and the connection electrode 2 may be formed through patterning a same film by one patterning process during forming the display substrate 10, and thus the manufacturing process of the display substrate is simplified.

It should be noted that, the expression of performing one patterning process on a certain film in the present disclosure means performing one patterning process on the certain film by a same mask.

For example, the bridge electrode 5, the source electrode and the drain electrode of the thin film transistor are made of a same material and are in a same layer, so that the source electrode and the drain electrode of the thin film transistor and the bridge electrode 5 may be formed through patterning a same film by one patterning process during forming the display substrate 10, so that the manufacturing process of the display substrate is further simplified.

For example, as illustrated in FIG. 3, the connection electrode 2 comprises a plurality of connection electrode lines intersecting with each other, the shape in a plan view of the connection electrode 2 is a shape of a grid. The shape in the plan view of the plurality of connection electrode lines intersecting with each other comprises a plurality of first stripes 21 extending along the first direction, and a plurality of second stripes 22 extending along the second direction. For example, the first direction is perpendicular to the second direction. The plurality of first stripes 21 intersect with the plurality of second stripes 22 to form the shape of grid. In the case where the conductive sealant 3 comprises an ultraviolet light (UV) curing material, because the conductive sealant 3 is overlapped with the wiring region in the direction perpendicular to the base substrate 1, it is normally required to allow ultraviolet light to pass through the wiring region and be incident on the conductive sealant 3 during curing the conductive sealant 3, the connection electrode 2 in the shape of grid is in favor of guaranteeing the wiring region to have a certain light transmittance, this is in favor of increasing the curing efficiency of the conductive sealant 3. Obviously, in other embodiments, the connection electrode 2 is not limited to adopt the shape of grid formed by the first stripes 21 and the second stripes 22, and may be a signal line in a line shape or a block electrode.

For example, a periphery circuit is formed in the non-display region 102. For example, the periphery circuit is a gate drive circuit (GOA), and the gate drive circuit comprises the connection electrode 2, the connection electrode 2 may be a signal line in the non-display region 102. For example, in the case where the connection electrode 2 is connected to the display electrode, the connection electrode 2 is a wire (VSS line, VDD line) for providing a power supply voltage; in the case where the connection electrode 2 is electrically connected with other electrodes provided on (or provided above) the sealant 3, for example, a bonding electrode (a bonding pad) for providing a signal for the connection electrode 2, the connection electrode 2 may also be other electrode or signal line, for example, a clock signal line and so on.

Figure 4F:
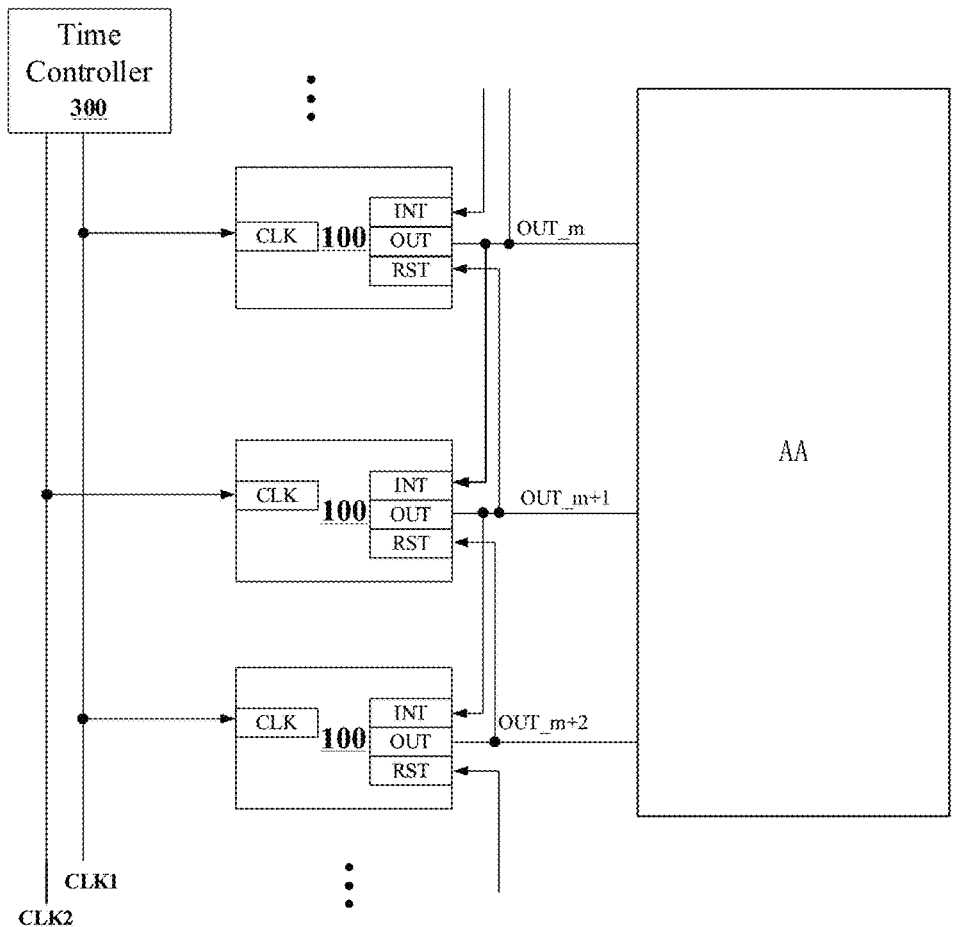
FIG. 4F is a schematic diagram of a gate drive circuit provided by an embodiment of the present disclosure.
Figure 4G:
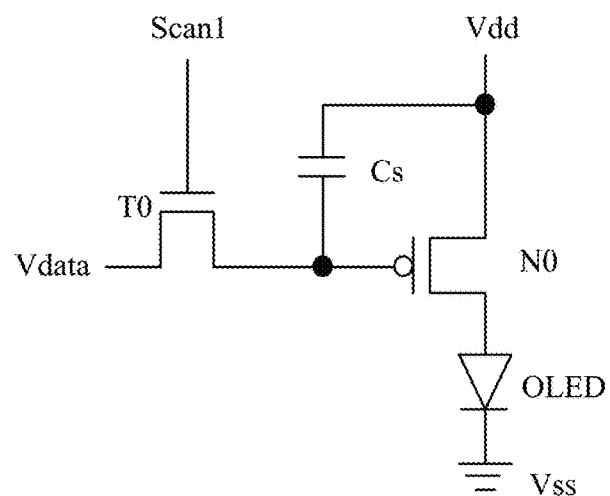
FIG. 4G is schematic diagram of a pixel circuit provided by an embodiment of the present disclosure.

Illustratively, FIG. 4F is a schematic diagram of a gate drive circuit provided by an embodiment of the present disclosure. As illustrated in FIG. 4F, the gate drive circuit comprises a plurality of shift register units 100 that are cascaded. For example, the gate drive circuit is directly integral on the display substrate by a semiconductor process same as that for forming the thin film transistor, so as to realize the driving function of progressive or interlaced scanning.

Except for the shift register unit at the first stage, an input terminal INT of each of the shift register units at other stages is connected with an output terminal OUT of the shift register unit at the previous stage; except for the shift register unit at the last stage, a reset terminal RST of each of the shift register units at other stages is connected with the output terminal OUT of the shift register unit at the next stage.

As illustrated in FIG. 4F, the gate drive circuit further comprises a first clock signal line CLK1 and a second clock signal line CLK2. For example, the connection electrode 2 comprises the first clock signal line CLK1 or the second clock signal line CLK2. For example, the first clock signal line CLK1 and the second clock signal line CLK2 are respectively connected with clock signal terminals CLK of the plurality of shift register units that are cascaded, so as to provide clock signals. For example, reset control signals comprises clock signals provided by the first clock signal line CLK1 and the second clock signal line CLK2. It should be noted that the gate drive circuit may also comprises four, six, eight, or more clock signal lines, the number of the clock signal lines may be set according to specific implementation situation, and no limitation is given here in embodiments of the present disclosure.

For example, as illustrated in FIG. 4F, each of the shift register units further comprises a clock signal terminal CLK, and is configured to connected with the first clock signal line CLK1 or the second clock signal line CLK2, so as to receive a first clock signal or a second clock signal. The first clock signal line CLK1 is connected with the clock signal terminal CLK of the shift register unit at the (2n-1)th stage (n is an integer larger than zero), the second clock signal line CLK2 is connected with the clock signal terminal CLK of the shift register unit at the (2n)th stage. It should be noted that, embodiments of the present disclosure comprise, but not limited to, the above connection ways. For example, the following connection way may be adopted: the first clock signal line CLK1 is connected with the clock signal terminal CLK of the shift register unit at the (2n)th stage, and the second clock signal line CLK2 is connected with the clock signal terminal CLK of the shift register unit at the (2n-1)th stage.

It should be noted that, in FIG. 4F, "OUT_m" (m is an integer larger than zero) represents the output terminal of the shift register unit at the (m)th stage, "OUT_m+1" represents the output terminal of the shift register unit at the (m+1)th stage, "OUT_m+2" represents the output terminal of the shift register unit at the (m+2)th stage, . . . .

For example, the input terminal INT of the shift register unit at the first stage is configured to receive a trigger signal STV, the reset terminal RST of the shift register unit at the last stage is configured to receive a reset signal, for the sake of clarity, the trigger signal STV and the reset signal are not illustrated in FIG. 4F.

For example, the gate drive circuit further comprises a first voltage line, a second voltage line, a third voltage line and a fourth voltage line (not illustrated in figures). For example, the first voltage line is connected with the first voltage terminal VDD, and is configured to provide the first voltage; the second voltage line is connected with the second voltage terminal VSS, and is configured to provide the second voltage; the third voltage line is connected with a third voltage terminal VGH1, and is configured to provide a third voltage; the fourth voltage line is connected with a fourth voltage terminal VGH2, and is configured to provide a fourth voltage.

For example, the connection electrode 2 comprises the above-mentioned first voltage line or second voltage line.

For example, as illustrated in FIG. 4F, the gate drive circuit 2 further comprises a time controller 300. For example, the time controller 300 is configured to be connected with the first clock signal line CLK1 and the second clock signal line CLK2, so as to provide clock signals to the shift register units; for example, the gate drive circuit 10 is further configured to be connected with the first voltage line, the second voltage line, the third voltage line and the fourth voltage line, so as to respectively provide the first voltage, the second voltage, the third voltage and the fourth voltage to the shift register units 100. For example, the time controller 300 is further configured to provide the trigger signal STV and the reset signal.

For example, the pixel circuit of each pixel unit of the display region comprises a display signal line (data line) configured to provide a signal for controlling a display greyscale to the light-emitting device, the periphery circuit may further comprise a portion, which extends into the periphery circuit region, of the display signal line, and the connection electrode 2 may also comprises the portion, which extends into the periphery circuit region, of the display signal line For example, the connection electrode 2 may also be a scan signal line for providing scan signals to the pixel units arranged in an array in the display region 101, and is connected with a gate line in the display region 101. For example, as illustrated in FIG. 4F, the connection electrode 2 comprises the scan signal line which is at the (m)th stage (m is an integer larger than zero) and extends from the output terminal OUT_m of the shift register unit at the (m)th stage into the display region (AA), the scan signal line which is at the (m+1)th stage and extends from the output terminal OUT_m+1 of the shift register unit at the (m+1)th stage into the display region, the scan signal line which is at the (m+2)th stage and extends from the output terminal OUT_m+2 of the shift register unit at the (m+2)th stage into the display region, . . . . No limitation is given in embodiments of the present disclosure regarding the number of the scan signal lines included by the connection electrode 2.

For example, in other embodiments, the connection electrode 2 may be a wire used in testing the display substrate. No limitation is given in embodiments of the present disclosure regarding the type of the connection electrode 2. With reference to FIG. 3 and FIG. 4A, for example, the display substrate comprises a plurality of the first via-holes 71, a plurality of the second via-holes 72 and a plurality of the bridge electrodes 5. The plurality of bridge electrodes 5 are spaced apart from each other, and therefore, the connection electrode 2 and the conductive sealant 3 are connected with each other at a plurality of positions; the conductive sealant 3 is divided into a plurality of portions which are arranged along a direction parallel to the base substrate; in the case where the display electrode 153 is provided on (or provided above) the conductive sealant 3, and the conductive sealant 3 and the display electrode 153 are electrically connected with each other so as to form a loop, the voltages from a power supply circuit is transmitted to the display electrode 153 through the connection electrode 2, the bridge electrode 5 and the conductive sealant 3, this is equivalent to that the plurality of portions of the conductive sealant 3 form a plurality of resistors in parallel with each other, this is in favor of reducing the resistance of the circuit formed from an end of the conductive sealant 3 closer to the base substrate 1 to an end of the conductive sealant 3 away from the base substrate 1, so that signal delay is reduced, and better display effect and higher power utilization efficiency are achieved. The numbers and positions of the first via-holes 71, the second via-holes 72 and the bridge electrodes 5 as illustrated in FIG. 3 are only an example, as long as the above functions can be realized, no limitation is given in embodiments of the present disclosure in this respect. For example, the material of the bridge electrode 5 is a metal material. Compared with transparent conductive materials, the resistivity of the metal material is relatively low, which is in favor of reducing signal delay; for example, the metal material includes at least one selected from a group consisting of copper, copper alloy, etc. For example, a shape in a plan view of each bridge electrode 5 of the plurality of bridge electrodes 5 is the shape of a block or the shape of a dot, and the plurality of bridge electrodes 5 are spaced apart from each other, this is in favor of improving the light transmittance of the wiring region. For example, the material of the bridge electrode 5 is a transparent conductive material. For example, the transparent metal oxide is indium tin oxide (ITO), indium zinc oxide (IZO), etc. Obviously, the material of the bridge electrode 5 is not limited to the types listed above. A transparent bridge electrode 5 is in favor of improving the light transmittance of the wiring region, especially when the density of the conductive wires in the wiring region is relatively large.

For example, the display substrate 10 further comprises a circuit board (not illustrated in figures), the circuit board comprises the power supply circuit, the connection electrode 2 is electrically connected with the power supply circuit of the circuit board, so that voltages from the power supply circuit can be transmitted through the connection electrode 2, the bridge electrode 5 and the conductive sealant 3. In the case where a display electrode electrically connected with the sealant 3 is provided on (or provided above) the sealant 3, the voltages from the power supply circuit can be transmitted to the display electrode through the conductive sealant 3, so that display function can be realized. For example, the circuit board is at a side, close to the base substrate 1, of the connection electrode 2, so as to facilitate the electrically connection between the connection electrode 2 and the circuit board. Alternatively, the circuit board is at a side, away from the connection electrode 2, of the base substrate 1, so as to facilitate realizing a narrow bezel. The circuit board may be in the display region, or may be in the non-display region. No limitation is given in embodiments of the present disclosure regarding the arrangement of the circuit board, and those skilled in the art can design according to conventional technology.

For example, the material of the conductive sealant 3 comprises conductive particles. The conductive particles, for example, are metal conductive particles. The size of the conductive particles is, for example, in microscale (for example, smaller than 100 microns). For example, a conductive material is formed by allowing the conductive particles to be evenly dispersed in an organic material, and the conductive sealant 3 is made of the above conductive material. Obviously, no limitation is given in embodiments of the present disclosure regarding the material of the conductive sealant 3. The material of the metal conductive particles is, for example, copper, or copper alloy, etc.

FIG. 4B is another schematic cross-sectional view taken along the line A-A' in FIG. 3, FIG. 4C is a further another schematic cross-sectional view taken along the line A-A' in FIG. 3. The display substrate 10 as illustrated in FIG. 4B further comprises an auxiliary electrode 8, and at least a part of the auxiliary electrode 8 is in the second via-hole 72 and electrically connects the conductive sealant 3 and the bridge electrode 5.

The auxiliary electrode 8 is in the non-display region. For example, a material of the auxiliary electrode 8 and the material of the first display electrode 151 are the same and the auxiliary electrode 8 and the first display electrode 151 are in a same layer.

For example, the material of the auxiliary electrode 8 is a metal material. Obviously, no limitation is given in embodiments of the present disclosure regarding the material of the auxiliary electrode. Because the conductive sealant 3 after being cured may be shrunken due to a fabrication error, a tiny gap is generated between the conductive sealant 3 and the bridge electrode 5, which causes a contact defect between the conductive sealant 3 and the bridge electrode 5 which is below the conductive sealant 3. The auxiliary electrode 8 can avoid the above contact defect and guarantee the conductive sealant 3 to be electrically connected with the bridge electrode well. However, even if the conductive sealant 3 is shrunken to a certain degree and the gap is generated between the conductive sealant 3 and the bridge electrode 5, because the depth of the second via-hole 72 is much smaller than the depth of the via-hole 700 in FIG. 1, in the display substrate provided by embodiments of the present disclosure, the gap is much smaller than the gap between the sealant 300 and the connection wire 200 in FIG. 1. Therefore, even if the conductive sealant 3 is shrunken to a certain degree, the display substrate provided by embodiments of the present disclosure can ameliorate the above problem of generating the bubbles.

For example, as illustrated in FIG. 4B, the auxiliary electrode 8 comprises a first portion 81 at the outside of the second via-hole 72 and a second portion 82 in the second via-hole 72, and the first portion of the auxiliary electrode 81 is in contact with the conductive sealant 3. The second portion of the auxiliary electrode 82 is between the conductive sealant 3 and the bridge electrode 5 and spaces the bridge electrode 5 apart from the conductive sealant 3. Alternatively, as illustrated in FIG. 4C, the second portion of the auxiliary electrode 82 exposes a part of the bridge electrode 5 and is in contact with the bridge electrode 5, so as to realize the electrical connection between the auxiliary electrode 8 and the bridge electrode 5. The conductive sealant 3 is in contact with the bridge electrode 5 through the second via-hole 72, so as to reduce the resistance between the bridge electrode and the conductive sealant 3 while guaranteeing the conductive sealant 3 to be electrically connected with the bridge electrode well.

Other features and technical effects of the display substrate 10 as illustrated in FIG. 4B and FIG. 4C are the same as those of the display substrate 10 as illustrated in FIG. 4A, please refer to the descriptions above, and no further description is given here.

FIG. 4D is another schematic plan view of a part of the wiring region of the display substrate as illustrated in FIG. 2, FIG. 4E is another schematic cross-sectional view taken along the line H-H' in FIG. 4D. The display substrate 10 as illustrated in FIG. 4D and FIG. 4E and the display substrate as illustrated in FIG. 4A are different in that, in FIG. 4D and FIG. 4E, in the direction perpendicular to the base substrate 1, the first via-hole 71 and the second via-hole 72 are partially overlapped with each other, that is, the orthographic projection of the first via-hole 71 on the base substrate 1 and the orthographic projection of the second via-hole 72 on the base substrate 1 are partially overlapped with each other and partially not overlapped with each other, so as to allow the depth of a part of the first via-hole 71 and the depth of part of the second via-hole 72 not to be superposed in the direction perpendicular to the base substrate 1. By this way, as compared with the case where the conductive sealant 3 is connected with the connection electrode 2 through a deeper via-hole passing through a plurality of layers, the depth of the portion, which is not overlapped with the first via-hole, of the second via-hole 72 is not superposed with the depth of the first via-hole 71, so that the depth of the part, which is not overlapped with the first via-hole, of the second via-hole 72 is relatively small, thus the technical effect that is same as or similar to that of the embodiment as illustrated in FIG. 4A can also achieved by the embodiment illustrated in FIG. 4E.

Other features and technical effect of the display substrate 10 as illustrated in FIG. 4D and FIG. 4E are the same as those of the display substrate 10 as illustrated in FIG. 4A, please refer to the descriptions above, and no further description is given here.

Figure 4H:
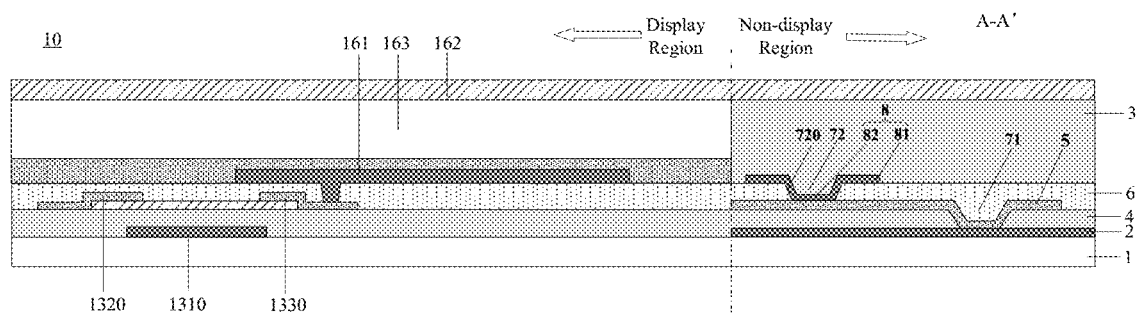
FIG. 4H is a further another schematic cross-sectional view taken along the line A-A' in FIG. 3 and a schematic cross-sectional view of another pixel region.

FIG. 4H is a further another schematic cross-sectional view taken along the line A-A' in FIG. 3 and a schematic cross-sectional view of the pixel region, and the present embodiment and the embodiment as illustrated in FIG. 4B have the following differences. As illustrated in FIG. 4H, the display substrate 1010 is a liquid crystal display substrate. The display substrate 10 comprises a pixel electrode 161, a common electrode 162 and a liquid crystal layer 163 sandwiched between the pixel electrode 161 and the common electrode 162. In the display panel adopting the display substrate, the pixel electrode 161 and the common electrode 162 form a liquid crystal deflection electrical field. The display substrate 10 further comprises a thin film transistor, and the thin film transistor comprises a gate electrode 1310, a source electrode 1320 and a drain electrode1330. The first display electrode is a pixel electrode 161, and the pixel electrode 161 is electrically connected with the drain electrode133. The second display electrode is the common electrode 162. In this case, the connection electrode 2 is a common electrode line (VSS) and is configured to provide a common voltage signal to the common electrode 162.

For example, the auxiliary electrode 8 and the pixel electrode 161 are in a same layer, and the material of the auxiliary electrode 8 and the material of the first electrode 151 are the same. Therefore, the pixel electrode 161 and the auxiliary electrode 8 may be formed through patterning a same film by one patterning process during forming the display substrate 10, so that the manufacturing process of the display substrate is further simplified.

Other features and technical effect of the display substrate 10 as illustrated in FIG. 4H are the same as those of the display substrate 10 as illustrated in FIG. 4B, please refer to the descriptions above, and no further description is given here.

Figure 5:
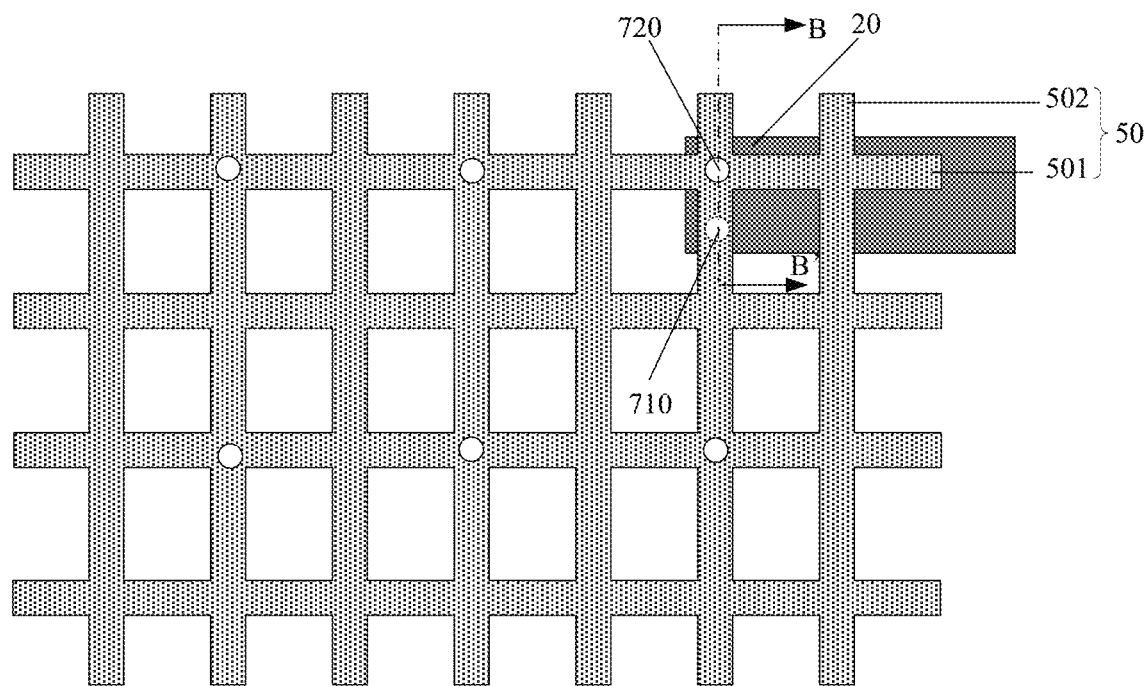
FIG. 5 is a further another schematic plan view of a part of the wiring region of the display substrate as illustrated in FIG. 2.
Figure 6:
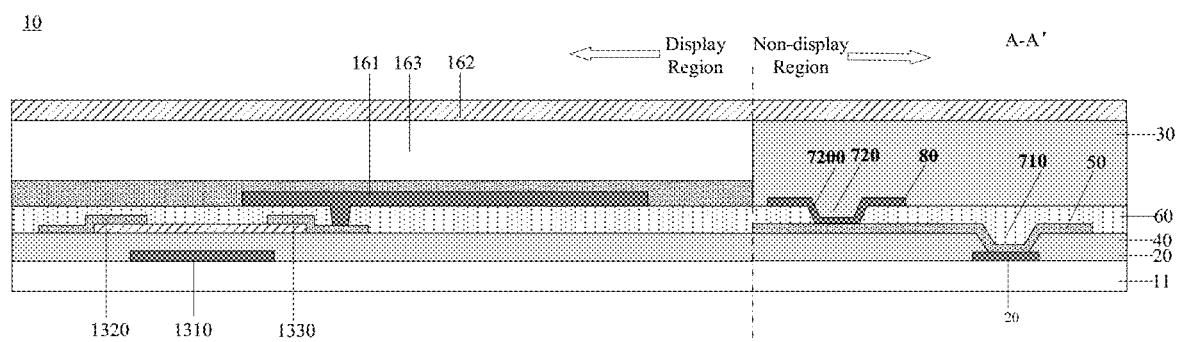
FIG. 6 is a schematic cross-sectional view taken along the line B-B' in FIG. 5 and a schematic cross-sectional view of the pixel region.

FIG. 5 is another schematic plan view of a part of the wiring region of the display substrate as illustrated in FIG. 2, FIG. 6 is a schematic cross-sectional view taken along the line B-B' in FIG. 5. The display substrate 10 as illustrated in FIG. 5 and FIG. 6 has the following differences as compared with the display substrate as illustrated in FIG. 3 and FIG. 4A.

As illustrated in FIG. 5 and FIG. 6, for example, the display substrate 10 comprises: a base substrate 11, a connection electrode 20 and a conductive sealant 30. The connection electrode 20 is on the base substrate 11. The display substrate 10 further comprises a first insulation layer 40, a bridge electrode 50 and a second insulation layer 60. The first insulation layer 40 is at a side, away from the base substrate 11, of the connection electrode 20. The first via-hole 710 is in the first insulation layer 40 and exposes a part of the connection electrode 20. The bridge electrode 50 is electrically connected with the connection electrode 20 through the first via-hole 710. The second insulation layer 60 is at a side, away from the base substrate 11, of the bridge electrode 50, the second via-hole 720 is in the second insulation layer 60 and exposes at least a part of the bridge electrode 50. The conductive sealant 30 is electrically connected with the bridge electrode 50 through the second via-hole 72, so that the electrical connection between the conductive sealant 30 and the connection electrode 20 is realized.

For example, the bridge electrode 50 comprises a plurality of bridge electrode lines intersecting with each other, a shape in a plan view of the bridge electrode 50 is a shape of grid. The shape in the plan view of the plurality of bridge electrode lines intersecting with each other comprises a plurality of first stripes 501 extending along the first direction, and a plurality of first stripes 502 extending along the second direction, for example, the first direction is perpendicular to the second direction. The plurality of first stripes 501 intersects with the plurality of first stripes 502 to form the grid. For example, the bridge electrode 50 is an integral structure, that is, the plurality of first stripes 501 and the plurality of first stripes 502 may be formed by patterning a same film through one patterning process, so that there is no seam between the plurality of first stripes 501 and the plurality of first stripes 502. Obviously, the bridge electrode 50 may also not be an integrally formed structure, for example, the plurality of first stripes 501 and the plurality of first stripes 501 are independent formed and intersected with each other, so as to form the bridge electrode 50.

As illustrated in FIG. 5, both the number of the connection electrodes 20 and the number of the first via-holes 710 are at least one, and the number of the second via-holes 720 is plural. Because the bridge electrode 50 is an integral structure, at the positions where the plurality of second via-holes 720 are located, the conductive sealant 30 is electrically connected with the bridge electrode 50 through the second via-hole 720, so that the conductive sealant 30 is divided into a plurality of portions which are in parallel with each other in a circuit (as described in the above embodiment); at the position where at least one first via-hole 710 is located, the bridge electrode 50 is electrically connected with the at least one connection electrode 20 through the at least one first via-hole 710, and the connection electrode 20 is connected with the power supply circuit, so that the electrical connection between the conductive sealant 30 and the connection electrode 20 is realized. For example, in the embodiment as illustrated in FIG. 5, both the number of the connection electrode 20 and the number of the first via-holes 710 are one. A shape in a plan view of the connection electrode 20 is a shape of stripe, and the stripe extends to the power supply circuit.

Other features of the embodiment as illustrated in FIG. 5 and FIG. 6 are the same as the above embodiments, please refer to the descriptions above, and the features in different embodiments of the present disclosure can be combined to obtain other embodiments.

At least one embodiment of the present disclosure further provides a display panel, the display panel comprises any one of the display substrates provided by embodiments of the present disclosure, and an opposite substrate which is opposite to the display substrate; the opposite substrate is provided with a display electrode 153, and the display electrode 153 is electrically connected with the conductive sealant.

Figure 7:
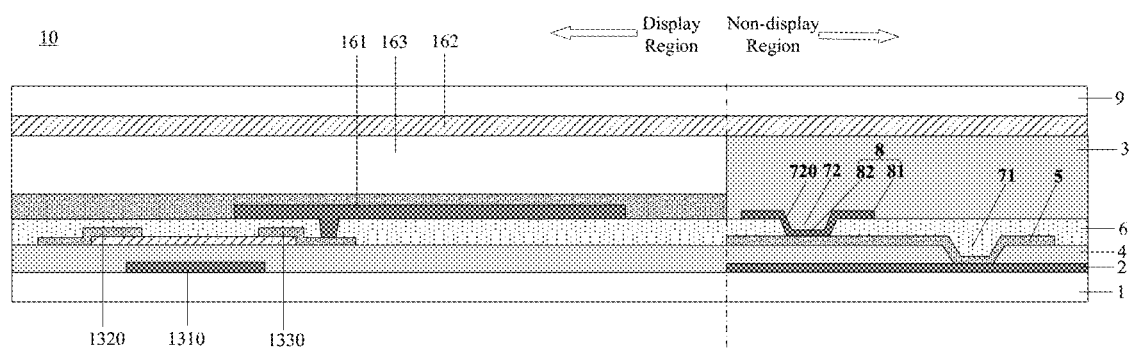
FIG. 7 is a structural schematic diagram of a display panel provided by an embodiment of the present disclosure.

Illustratively, FIG. 7 is a structural schematic diagram of a display panel 100 provided by an embodiment of the present disclosure. FIG. 7 is illustrated by taking the case where the display panel 100 comprises the display substrate as illustrated in FIG. 4H as an example. The display panel is a liquid crystal display panel. The display panel 100 further comprises an opposite substrate 9. For example, the common electrode 162 is provided on the opposite substrate 9, and the opposite substrate 9 is a color filter substrate that is provided with a color filter (not illustrated in figures).

For example, the display panel provided by another embodiment of the present disclosure comprises any one of the display substrates 10 as illustrated in FIG. 4A-4C, FIG. 4E and FIG. 6. In this case, the display panel is an electroluminescent display panel, for example, an OLED display panel. Other structures of the OLED display panel that are not mentioned can refer to conventional technologies.

It should be noted that, FIG. 7 only illustrates a part of the display panel 100, and other structures of the display panel 100 can refer to conventional technologies.

A least one embodiment of the present disclosure further provides a display apparatus, and the display apparatus comprises any one of the display panels provided by embodiments of the present disclosure. For example, the display apparatus may be implemented as any products or components that has display function, such as a phone, a tablet computer, a television, a display screen, a laptop, a digital photo frame and a navigator. Regarding other structures of the display apparatus, those skilled in the art can refer to conventional technologies.

At least one embodiment of the present disclosure further provides a manufacturing method of a display substrate, and the manufacturing method comprises: providing a base substrate; forming a connection electrode on the base substrate; forming a conductive sealant at a side, away from the base substrate, of the connection electrode, in which the conductive sealant is electrically connected with the connection electrode through a plurality of via-holes respectively in different layers; and in a direction perpendicular to the base substrate, the plurality of via-holes are at least partially not overlapped with each other.

Illustratively, FIG. 8A-FIG. 8G are schematic diagrams of a manufacturing method of the display substrate provided by an embodiment of the present disclosure. The display substrate comprises a display region and a non-display region at the periphery of the display region. The non-display region comprises a wiring region, and all of the connection electrode, the conductive sealant, the bridge electrode and the auxiliary electrode provided by embodiments of the present disclosure are in the non-display region, for example, are in the wiring region. Therefore, FIG. 8A-FIG. 8G do not illustrate the structure of the display region, Those skilled in the art can design the display region according to conventional technologies.

Figure 8A:
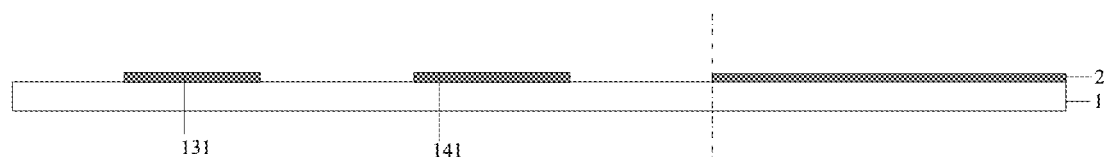
FIG. 8A-FIG. 8G are schematic diagrams illustrating a manufacturing method of a display substrate provided by an embodiment of the present disclosure.

As illustrated in FIG. 8A, the method comprises: providing a base substrate 1, and forming a connection electrode 2 on the base substrate 1. For example, the manufacturing method of the display substrate further comprises: forming a thin film transistor, which comprises: forming a gate electrode, a source electrode and a drain electrode. For example, after a first conductive layer is formed on the base substrate 1, the connection electrode 2, the gate electrode 131 of the thin film transistor and the above first terminal 141 of the storage capacitor Cs are formed through performing one patterning process on the first conductive layer, so that the manufacturing process is simplified, the manufacturing efficiency is improved and the cost is saved. For example, the connection electrode 2 is in the non-display region. For example, the patterning process is a photolithography process. For example, the first conductive layer is formed through a method of deposition or sputtering. The material of the connection electrode 2 may be referred to the description as described in the above embodiments. The features of the shape in the plan view of the connection electrode 2 are illustrated in FIG. 3 and may be referred to the description as described above.

Figure 8B:
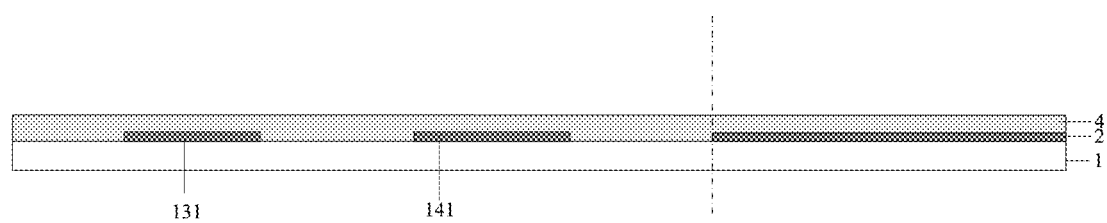

As illustrated in FIG. 8B, a first insulation layer 4 is formed at a side, away from the base substrate 1, of the connection electrode 2; the first insulation layer 4 covers the connection electrode 2, the gate electrode 131 and the first terminal 141 of the storage capacitor Cs. For example, the first insulation layer 4 is a gate insulation layer, so as to simplify the structure of the display substrate and simplify the manufacturing process. For example, the first insulation layer 4 is formed by a method such as coating.

Figure 8C:
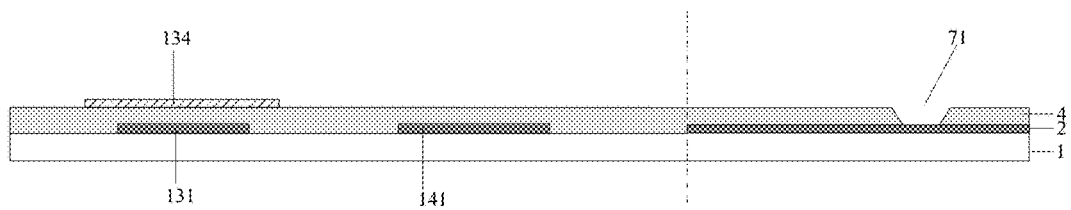

As illustrated in FIG. 8C, a first via-hole 71 is formed in the first insulation layer 4, the first via-hole 71 exposes a part of the connection electrode 2. For example, the first via-hole 71 is formed through a photolithography process with a first mask, and an active layer 134 of the thin film transistor is formed on the first insulation layer 4.

Figure 8D:
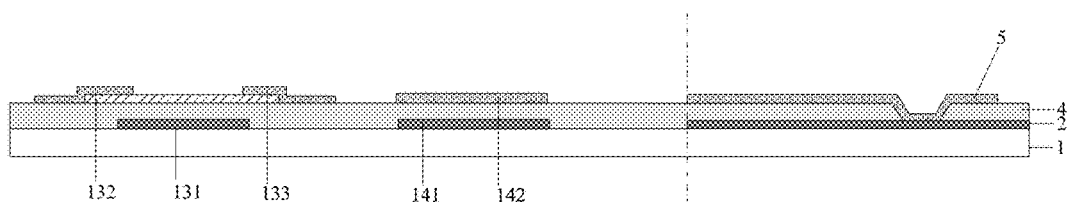

As illustrated in FIG. 8D, a bridge electrode 5 is formed, and the bridge electrode 5 is electrically connected with the connection electrode 2 through the first via-hole 71. For example, after a second conductive layer is formed on the first insulation layer 4, the bridge electrode 5, the source electrode and the drain electrode of the thin film transistor, and the second terminal 142 of the storage capacitor Cs are formed by performing one patterning process on the second conductive layer, so that the manufacturing process is further simplified, the manufacturing efficiency is improved and the cost is reduced. For example, the patterning process is a photolithography process. For example, the second conductive layer is formed through a method of deposition or sputtering. The material of the bridge electrode 5 may be referred to the description as described in the above embodiments. The features of the shape in the plan view of the bridge electrode 5 are illustrated in FIG. 3 and may be referred to the description as described above.

Figure 8E:
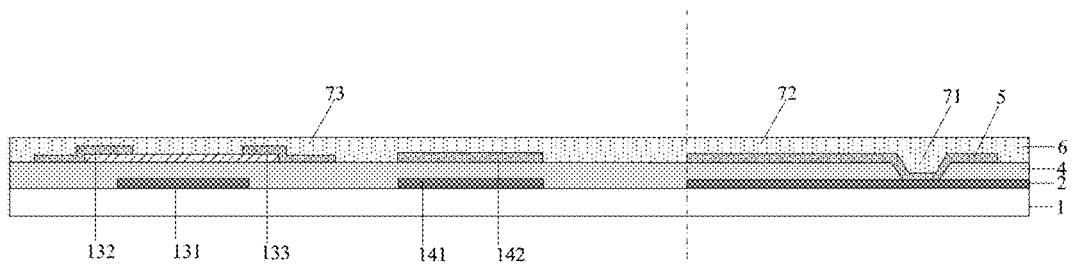

As illustrated in FIG. 8E, a second insulation layer 6 is formed at the side, away from the base substrate 1, of the bridge electrode 5. The second insulation layer 6 covers the bridge electrode 5, the source electrode 132 and the drain electrode133 of the thin film transistor and the second terminal 142 of the storage capacitor Cs. For example, the second insulation layer 6 is formed through a method of coating.

Figure 8F:
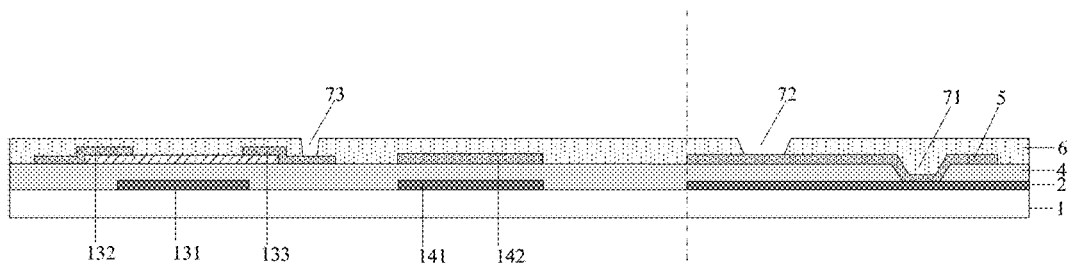

As illustrated in FIG. 8F, a second via-hole 72 and a third via-hole 73 are formed in the second insulation layer 6. The second via-hole 72 exposes a part of the bridge electrode 5. The third via-hole 73 exposes a part of the drain electrode133. The first via-hole 71 and the second via-hole 72 are not overlapped with each other in the direction perpendicular to the base substrate 1, that is, an orthographic projection of the first via-hole 71 on the base substrate 1 and an orthographic projection of the second via-hole 72 on the base substrate 1 are not overlapped with each other (no overlapping portion exists). Please refer to the above descriptions for the plan view of the first via-hole 71 and the second via-hole 72.

The display region comprises a plurality of pixels, and the manufacturing method further comprises: forming a first display electrode in each of the plurality of pixels, and a second display electrode at a side, away from the base substrate, of the first display electrode.

Figure 8G:
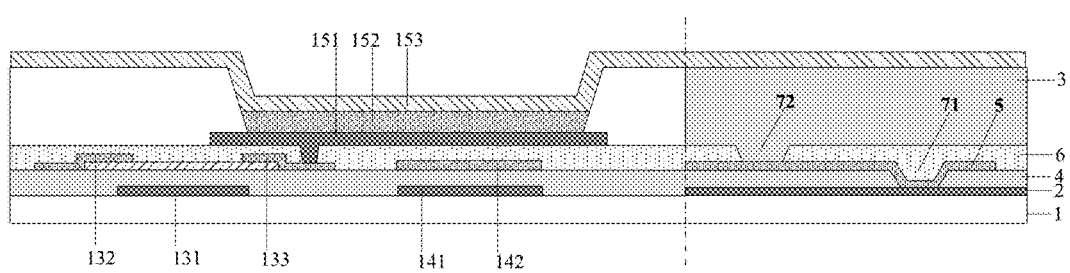

As illustrated in FIG. 8G, in each of the plurality of pixels, the first display electrode (a first electrode 151), a light-emitting layer 152 and the second display electrode (a second electrode 153) are formed at the side of the connection electrode 2 away from the base substrate, and a conductive sealant 3 is formed. The conductive sealant 3 is electrically connected with the bridge electrode 5 through the second via-hole 72, so that the conductive sealant 3 is electrically connected with the connection electrode 2 through the first via-hole 71 and the second via-hole 72. The second electrode 153 extends from the display region into the non-display region, and the second electrode 153 is at a side, away from the base substrate 1, of the conductive sealant 3 and is electrically connected with the conductive sealant 3; for example, the second electrode 153 is in contact with the conductive sealant 3. In this way, the display substrate as illustrated in FIG. 4A is obtained.

Please refer to the description as described above for the technical effect of the display substrate formed by adopting the manufacturing method of the display substrate provided by embodiments of the present disclosure.

Figure 9A:
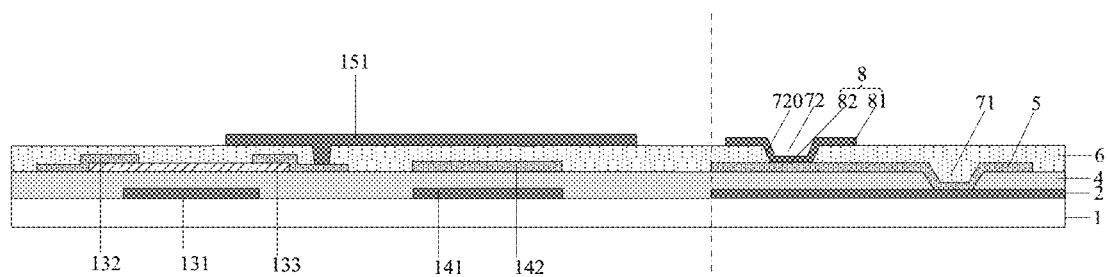
FIG. 9A-FIG. 9B are schematic diagrams illustrating another manufacturing method of a display substrate provided by an embodiment of the present disclosure.
Figure 9B:
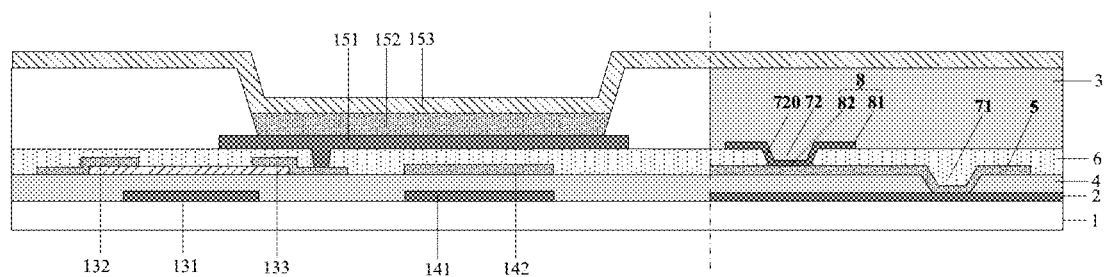
Figure 10A:
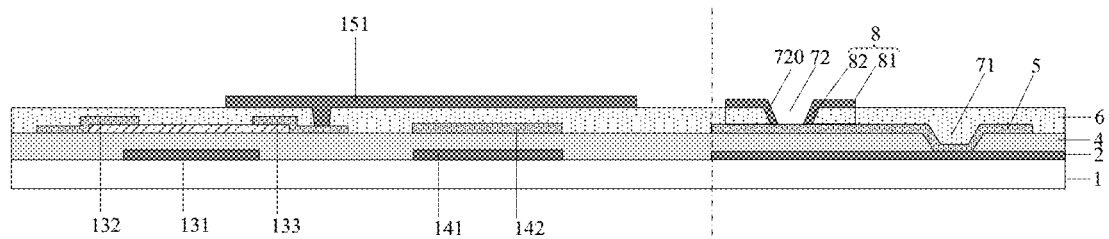
FIG. 10A-FIG. 10B are schematic diagrams illustrating further another manufacturing method of a display substrate provided by an embodiment of the present disclosure.
Figure 10B:
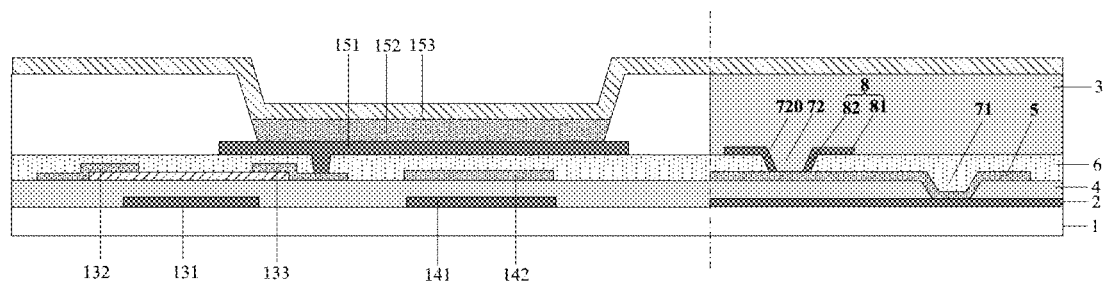

FIG. 9A-FIG. 9B are schematic diagrams of another manufacturing method of a display substrate provided by an embodiment of the present disclosure, and FIG. 10A-FIG. 10B are schematic diagrams of further another manufacturing method of a display substrate provided by an embodiment of the present disclosure. As illustrated in FIG. 9A, after the steps as illustrated in FIGS. 8A-8F are performed, the manufacturing method of the display substrate further comprises: forming an auxiliary electrode 8 and the first electrode 151 in a pixel. The auxiliary electrode 8 and the first electrode 151 are formed by performing one patterning process on a same film. At least a part of the auxiliary electrode 8 is in the second via-hole 72 and the auxiliary electrode 8 electrically connects the conductive sealant 3 and the bridge electrode 5. The auxiliary electrode 8 comprises a first portion 81 that is not in the second via-hole 72 and the second portion 82 that is in the second via-hole 72, the first portion of the auxiliary electrode 81 is in contact with the conductive sealant 3. In FIG. 9A, for example, the second portion of the auxiliary electrode 82 is between the conductive sealant 3 and the bridge electrode 5.

For example, a third conductive layer is formed on the second insulation layer 6, and for example, a material of the third conductive layer is a transparent conductive material such as ITO, IZO, and so on. The pixel electrode and the auxiliary electrode 8 are formed by performing one patterning process on the third conductive layer, so that the manufacturing process of the display substrate is further simplified.

As illustrated in FIG. 9B, a conductive sealant 3 is formed at the side of the connection electrode 2 away from the base substrate, the conductive sealant 3 is electrically connected with the bridge electrode 5 through the second via-hole 72, so that the conductive sealant 3 is electrically connected with the connection electrode 2 through the first via-hole 71 and the second via-hole 72, and the display substrate as illustrated in FIG. 4B is obtained.

Alternatively, as illustrated in FIG. 10A, after the steps as illustrated in FIGS. 8A-8F are performed, the manufacturing method of the display substrate further comprises: forming an auxiliary electrode 8. The auxiliary electrode 8 and the first electrode 151 are formed by performing one patterning process on a same film. In FIG. 10A, the second portion of the auxiliary electrode 82 exposes a part of the bridge electrode 5 and is electrically connected with the bridge electrode 5, the conductive sealant 3 is in contact with the bridge electrode 5 through the second via-hole 72, so as to reduce the resistance between the bridge electrode and the conductive sealant 3 while guaranteeing the conductive sealant 3 to be electrically connected with the bridge electrode well.

As illustrated in FIG. 10B, a conductive sealant 3 is formed at the side, away from the base substrate, of the connection electrode 2, and the conductive sealant 3 is electrically connected with the bridge electrode 5 through the second via-hole 72, so that the conductive sealant 3 is electrically connected with the connection electrode 2 through the first via-hole 71 and the second via-hole 72, and thus the display substrate as illustrated in FIG. 4C is obtained.

The manufacturing method of the display substrate as illustrated in FIG. 4D differs from the manufacturing method of the display substrate as illustrated in FIG. 8A-FIG. 8G in that, the plan view of the second via-hole obtained by patterning the second insulation layer by the method in FIG. 4D is different from the plan view obtained by the method as illustrated in FIG. 8A-FIG. 8G. For the manufacturing method for forming the display substrate as illustrated in FIG. 5-FIG. 6, it differs from the manufacturing method as illustrated in FIG. 8A-FIG. 8G in that, the plan view of the connection electrode obtained by patterning the first conductive layer, the plan view of the bridge electrode obtained by patterning the second conductive layer, the plan view of the first via-hole obtained by patterning the first insulation layer, and the plan view of the second via-hole obtained by patterning the second insulation layer by the method in FIG. 5-FIG. 6, are different from the plan views obtained by the method as illustrated in FIG. 8A-FIG. 8G. Please refer to the description as described above for the plan views of the above structures.

At least one embodiment of the present disclosure further provides a manufacturing method of a display panel, and manufacturing method of the display panel comprises: obtaining a display substrate by any one of the manufacturing methods of the display substrate provided by the embodiments of the present disclosure and forming an opposite substrate which is opposite to the display substrate. The opposite substrate is provided with a display electrode 153, and the display electrode 153 is electrically connected with the conductive sealant.

For example, the opposite substrate is provided, and the display electrode 153 and other component for displaying are formed on the opposite substrate. For example, the display electrode 153 is a common electrode, and the connection electrode 2 is configured to provide a common voltage signal to the common electrode. For example, the display panel is a liquid crystal display panel, for example, a liquid crystal display panel of type TN. For example, the display substrate is an array substrate provided with pixel electrodes, and the opposite substrate is a color filter substrate provided with a common electrode. For example, other components for displaying comprise a color filter, a black matrix, etc. For example, after a conductive sealant is formed, the manufacturing method of the display panel further comprises forming a liquid crystal layer on the display substrate, and then, the opposite substrate is adhered to the display substrate through the conductive sealant, so as to obtain the display panel. Other specific processing steps can be realized by those skilled in the art according to conventional technology, and no limitation will be given in embodiments of the present disclosure in this respect.

What are described above is related to the illustrative embodiments of the disclosure only and not limitative to the scope of the disclosure; the scopes of the disclosure are defined by the accompanying claims.

What is claimed is:

1. A display substrate, comprising:
   a base substrate;
   a connection electrode on the base substrate;
   a conductive sealant which is at a side, away from the base substrate, of the connection electrode and is electrically connected with the connection electrode via a plurality of via-holes respectively in different layers; and
   a bridge electrode which is at least partially in at least one via-hole of the plurality of via-holes, and is electrically connected with the connection electrode and the conductive sealant,
   wherein in a direction perpendicular to a surface of the base substrate on which the connection electrode is provided, the plurality of via-holes are at least partially not overlapped with each other;
   the display substrate comprises:
   a display region comprising a plurality of pixels, wherein each of the plurality of pixels comprises a first display electrode, and a second display electrode at a side, away from the base substrate, of the first display electrode; and
   a non-display region at a periphery of the display region, wherein the connection electrode, the conductive sealant and the bridge electrode are in the non-display region;
   the plurality of via-holes comprise a first via-hole and a second via-hole that are respectively in different layers,
   the display substrate further comprises: a first insulation layer and a second insulation layer, the first insulation layer is at the side, away from the base substrate, of the connection electrode, and the second insulation layer is at a side, away from the base substrate, of both the first insulation layer and the bridge electrode, the first via-hole penetrates through the first insulation layer and does not penetrates through the second insulation layer, and the second via-hole penetrates through the second insulation layer and does not penetrates through the first insulation layer, the first via-hole and the second via-hole are at least partially not overlapped with each other in the direction perpendicular to the surface of the base substrate;
   the first via-hole exposes at least a part of the connection electrode, a part of the bridge electrode is in the first via-hole and contacts the connection electrode to be electrically connected with the connection electrode;
   the second via-hole exposes at least a part of the bridge electrode, a part of the conductive sealant is in the second via-hole and is electrically connected with the connection electrode;
   the conductive sealant is on a side, away from the base substrate, of the entire bridge electrode, and the entire bridge electrode is between the entire conductive sealant and the connection electrode in the direction perpendicular to the surface of the base substrate, and the conductive sealant covers the entire second via hole;
   both a total number of the connection electrode and a total number of the first via-hole are at least one, and a total number of the second via-hole is multiple.

2. The display substrate according to claim 1, wherein the second display electrode extends from the display region into the non-display region; and
   the second display electrode is at a side, away from the base substrate, of the conductive sealant and is electrically connected with the conductive sealant.

3. The display substrate according to claim 2, wherein the second display electrode is a common electrode, and the connection electrode is configured to provide a common voltage signal to the common electrode.

4. The display substrate according to claim 2, further comprising:
   an auxiliary electrode which is at least partially in the second via-hole and electrically connects the conductive sealant and the bridge electrode.

5. The display substrate according to claim 4, wherein the auxiliary electrode comprises a first portion outside the second via-hole, and a second portion in the second via-hole, the first portion and the second portion are structured as an integral structure, and the first portion of the auxiliary electrode is in contact with the conductive sealant; and
   the second portion of the auxiliary electrode is between the conductive sealant and the bridge electrode, the bridge electrode is spaced apart from the conductive sealant by the second portion of the auxiliary electrode, and the second portion of the auxiliary electrode is in contact with both of the conductive sealant and the bridge electrode.

6. The display substrate according to claim 4, wherein the auxiliary electrode comprises a first portion outside the second via-hole, and a second portion in the second via-hole, the first portion and the second portion are structured as an integral structure, and the first portion of the auxiliary electrode is in contact with the conductive sealant;
   the second portion of the auxiliary electrode exposes a part of the bridge electrode and is in contact with the bridge electrode, and the conductive sealant is in contact with the bridge electrode through the second via-hole.

7. The display substrate according to claim 4, wherein the auxiliary electrode is in the non-display region, a material of the auxiliary electrode is same as a material of the first display electrode, and the auxiliary electrode and the first display electrode are in a same layer.

8. The display substrate according to claim 1, wherein the connection electrode comprises a plurality of connection electrode lines intersecting with each other, a shape in a plan view of the connection electrode is a shape of grid; and
the display substrate comprises a plurality of the first via-holes, a plurality of the second via-holes and a plurality of the bridge electrodes, and the plurality of the bridge electrodes are spaced apart from each other.

9. The display substrate according to claim 1, wherein the bridge electrode comprises a plurality of bridge electrode lines intersecting with each other, a shape in a plan view of the bridge electrode is a shape of grid; and
each of a total number of the connection electrodes and a total number of the first via-holes is at least one, and a total number of the second via-holes is plural.

10. The display substrate according to claim 1, further comprising:
a thin film transistor on the base substrate and comprising a gate electrode, a source electrode and a drain electrode, wherein a material of the bridge electrode is same as a material of the source electrode and the drain electrode, and the bridge electrode is in a same layer as the source electrode and the drain electrode; or,
wherein a material of the connection electrode is same as a material of the gate electrode, and the connection electrode is in a same layer as the gate electrode.

11. The display substrate according to claim 1, wherein an orthographic projection of the first via-hole on the base substrate and an orthographic projection of the second via-hole on the base substrate are completely not overlapped with each other.

12. The display substrate according to claim 1, wherein a material of the conductive sealant comprises conductive particles.

* * * * *